United States Patent
Watanabe et al.

(10) Patent No.: US 9,437,486 B2
(45) Date of Patent: Sep. 6, 2016

(54) SPUTTERING TARGET

(75) Inventors: Koichi Watanabe, Yokohama (JP);
Yasuo Kohsaka, Yokohama (JP);
Takashi Watanabe, Yokohama (JP);
Takashi Ishigami, Yokohama (JP);
Yukinobu Suzuki, Yokohama (JP);
Naomi Fujioka, Zama (JP)

(73) Assignee: KABUSHIKI KAISHA TOSHIBA, Kawasaki-Shi (JP)

( * ) Notice: Subject to any disclaimer, the term of this patent is extended or adjusted under 35 U.S.C. 154(b) by 307 days.

(21) Appl. No.: 13/280,873

(22) Filed: Oct. 25, 2011

(65) Prior Publication Data
US 2012/0038050 A1    Feb. 16, 2012

Related U.S. Application Data
(63) Continuation of application No. 09/720,730, filed as application No. PCT/JP99/03407 on Jun. 25, 1999, now abandoned.

(30) Foreign Application Priority Data

Jun. 29, 1998  (JP) .................................... 10-182689
Jul. 17, 1998  (JP) .................................... 10-204001
Jul. 28, 1998  (JP) .................................... 10-212829

(51) Int. Cl.
| | |
|---|---|
| C22C 27/02 | (2006.01) |
| C23C 14/34 | (2006.01) |
| H01L 21/285 | (2006.01) |
| H01L 21/768 | (2006.01) |

(52) U.S. Cl.
CPC ..... *H01L 21/76843* (2013.01); *C23C 14/3414* (2013.01)

(58) Field of Classification Search
CPC .................... C23C 14/3414; H01L 21/76843
USPC ........................ 257/758; 204/298.12, 298.13
See application file for complete search history.

(56) References Cited

U.S. PATENT DOCUMENTS

| | | | |
|---|---|---|---|
| 4,720,300 A | 1/1988 | Nishizawa et al. | |
| 4,842,706 A * | 6/1989 | Fukasawa et al. | 204/298.13 |
| 5,242,481 A | 9/1993 | Kumar | |
| 5,409,862 A | 4/1995 | Wada et al. | |
| 5,580,516 A | 12/1996 | Kumar | |
| 5,661,345 A | 8/1997 | Wada et al. | |

(Continued)

FOREIGN PATENT DOCUMENTS

| | | |
|---|---|---|
| EP | 0 307 272 A2 | 3/1989 |
| JP | 62-103335 A | 5/1987 |

(Continued)

*Primary Examiner* — Sikyin Ip
(74) *Attorney, Agent, or Firm* — Foley & Lardner LLP

(57) ABSTRACT

A sputtering target contains high purity Nb of which Ta content is 3000 ppm or less and oxygen content is 200 ppm or less. Dispersion of the Ta content in all the sputtering target is within ±30% as a whole target. Dispersion of the oxygen content is within ±80% as a whole target. According to such sputtering target, an interconnection film of low resistivity can be realized. In addition, each grain of Nb in the sputtering target has a grain diameter in the range of 0.1 to 10 times an average grain diameter and ratios of grain sizes of adjacent grains are in the range of 0.1 to 10. According to such sputtering target, giant dust can be largely suppressed from occurring. The sputtering target is suitable for forming a Nb film as liner material of an Al interconnection.

4 Claims, 1 Drawing Sheet

(56) References Cited

U.S. PATENT DOCUMENTS

| | | |
|---|---|---|
| 5,693,203 A | 12/1997 | Ohhashi et al. |
| 5,831,694 A | 11/1998 | Onisawa et al. |
| 6,085,966 A | 7/2000 | Shimomuki et al. |

FOREIGN PATENT DOCUMENTS

| | | |
|---|---|---|
| JP | 63-138790 A | 6/1988 |
| JP | 64-042857 A | 2/1989 |
| JP | 03-036229 A | 2/1991 |
| JP | 04-099171 A | 3/1992 |
| JP | 04-308081 A | 10/1992 |
| JP | 06-140393 A | 5/1994 |
| JP | 08-096341 A | 4/1996 |
| JP | 09-026598 A | 1/1997 |
| JP | 09-143707 A | 6/1997 |
| JP | 10-158829 A | 6/1998 |
| JP | 11-054611 A | 2/1999 |

* cited by examiner

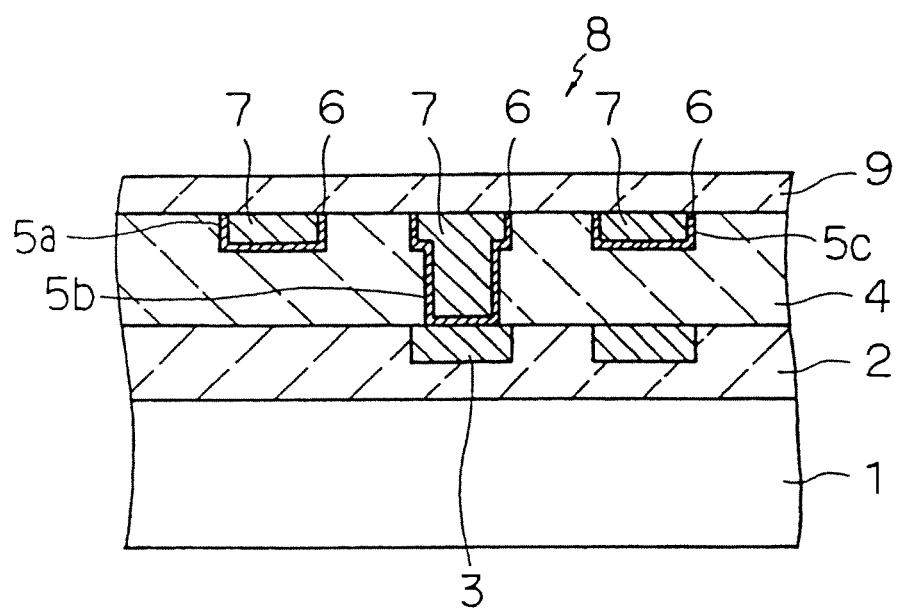

SPUTTERING TARGET

CROSS-REFERENCE TO RELATED APPLICATIONS

The present application is a Continuation of U.S. application Ser. No. 09/720,730, filed Dec. 29, 2000, now abandoned which is based upon PCT National Stage Application No. PCT/JP99/03407 filed Jun. 25, 1999, and claims the benefit of priority from prior Japanese Patent Application Nos. 10-182689, filed Jun. 29, 1998, 10-204001, filed Jul. 17, 1998 and 10-212829, filed Jul. 28, 1998, the entire contents of each of these applications are incorporated herein by reference.

TECHNICAL FIELD

The present invention relates to a Nb sputtering target suitable for forming liner material of a semiconductor element or the like.

BACKGROUND ART

In recent years, semiconductor industry typical in LSIs is increasing rapidly. In semiconductor elements of 64 Mbit DRAMs and subsequent ones, the higher the integration, reliability and functionality become, the higher accuracy is demanded for microfabrication technology. With such higher densification of an integrated circuit, a width of metal interconnection formed essentially of Al or Cu is becoming ¼µm or less.

On the other hand, to operate an integrated circuit at a high speed, it is indispensable to reduce resistance of an Al interconnection or a Cu interconnection. In the existing interconnection structure, the interconnection resistance is generally reduced due to an increase in the height of the interconnection. However, in semiconductor devices where further higher integration and densification are achieved, an existing stacking structure causes a poor coverage of an insulating film formed on the interconnection, resulting naturally in a deterioration of yield. Accordingly, the interconnection technology of the devices itself is demanded to improve.

Accordingly, dual damascene (DD) interconnection technology different from the existing one is under study. In the DD interconnection technology, first, on a substrate film thereon an interconnection trench is previously formed, metal essentially consisting of Al or Cu that is interconnection material is deposited by use of sputtering method or CVD method to form a film. Then, after letting fill the interconnection metal in the trench due to heat treatment (reflow), an excess of the interconnection metal is removed by use of CMP (Chemical Mechanical Polishing) method or the like.

Here, in a DD interconnection structure, how to excellently fill Al or the like in the interconnection trench is of importance. As filling technology, the aforementioned reflow technology or the like can be applied. As a film improving reflow characteristic of Al (liner film), a Ti film is generally used. However, the Ti film, in the step of reflow, reacts with Al to form $Al_3Ti$ compound to result in a remarkable increase of the interconnection resistance.

In view of these, the liner materials to Al in the place of Ti are variously under study. Among these, Nb in particular is reported to be effective in use. Nb, in comparison with Ti, can reduce the interconnection resistance and improve reflow characteristics of Al.

When considering an application in the next generation semiconductor memories such as DRAMs of an integration rate of 256 Mbit or 1 Gbit or more, resistivity of an interconnection film is demanded to be 4 µΩcm or less, for instance. However, when with a Nb film deposited by use of an existing Nb target as the liner material, thereon an Al film or Al alloy film is deposited to form an Al interconnection film, it is difficult to suppress the resistivity to 4 µΩcm or less with reproducibility.

In addition, though being necessary to suppress admixture of dust in the interconnection film as much as possible, in the existing Nb target, there is a problem that giant dust such as exceeding 1 µm for instance occurs suddenly. As a result, product yield of the semiconductor devices remarkably deteriorates.

As mentioned above, in the Al interconnection film having the Nb liner film formed by use of the existing Nb target, the resistivity of for instance 4 µΩcm or less that is demanded for the DRAMs of 256 Mbit or 1 Gbit or more can not be satisfied sufficiently and with reproducibility. Further, during deposition of the Nb liner film, the giant dust suddenly occurs to result in a decrease of the product yield of the semiconductor devices. Thus, the existing Nb target faces a difficulty in applying in the next generation semiconductor memories or the like.

An object of the present invention is to provide a sputtering target that, in applying the DD interconnection technology to form an Al interconnection film, enables to heighten electrical characteristics and quality of the Nb film as liner material of the Al film. In specific, the object is to provide a sputtering target that enables to obtain with reproducibility a Nb film capable of suppressing the resistivity of an Al interconnection film to for instance 4 µΩcm or less. In addition, another object is to provide a sputtering target enabling to suppress a sudden occurrence of the giant dust and to improve the product yield of Nb films.

DISCLOSURE OF THE INVENTION

A first sputtering target of the present invention is characterized in consisting essentially of high purity Nb of which Ta content is 3000 ppm or less. The first sputtering target is further characterized in that the dispersion of the Ta content in the target is within 30%.

A second sputtering target of the present invention is characterized in consisting essentially of high purity Nb wherein each grain of the Nb has a grain diameter in the range of 0.1 to 10 times an average grain diameter and ratios of grain diameters of adjacent grains are in the range of 0.1 to 10. The second sputtering target is further characterized in that the dispersion of the grain size ratio between adjacent grains in the target is within 30%.

A third sputtering target of the present invention is characterized in consisting essentially of high purity Nb of which the oxygen content is 200 ppm or less. The third target is further characterized in that the dispersion of the oxygen content in the target is within 80%.

Ta contained in the Nb target is easily oxidized than Nb is and oxides of Ta (such as $Ta_2O_5$ or the like) are very stable. Furthermore, above a certain temperature, Ta reacts easily with Al to form an intermetallic compound such as $Al_3Ta$. Such oxides and intermetallic compounds in the interconnection cause an increase of the resistivity.

In the first sputtering target, a content of Ta as an impurity is set at 3000 ppm or less. In addition, the dispersion of Ta content over the whole target is set within ±30%. According to the high purity Nb target in which the Ta content is reduced, a Ta content in a Nb film deposited therewith can be suppressed low. Accordingly, an increase of the resistivity of an interconnection film due to generation of $Ta_2O_5$ or $Al_3Ta$ can be largely suppressed.

In the third sputtering target, a content of oxygen as an impurity is set at 200 ppm or less. Further, the dispersion of the oxygen content in the target is set within 80%. A reduction of the oxygen content in the high purity Nb target enables to suppress a content of oxygen in a Nb film deposited therewith. Thereby, $Ta_2O_5$ causing an increase of the resistivity in the interconnection film can be suppressed from generating, resulting in realization of low resistivity of the interconnection film.

Reasons incapable of suppressing with reproducibility the resistivity of the interconnection film deposited by use of the existing Nb target to for instance 4 μΩcm or less are due to the aforementioned Ta contained in Nb. The present inventors first found this fact. The sputtering target of the present invention is achieved by finding an influence of Ta in particular Ta oxides such as $Ta_2O_5$ existing in a Nb film on the interconnection film.

As to the giant dust (particles) generated suddenly from the existing Nb target, it was found that when grains try to recover strain due to a thermal influence, difference in amounts of the strain due to size difference of grains causes the sudden generation of the giant dust. That is, when there is a large difference between grain sizes of adjacent grains, in the course of a larger grain recovering strain, smaller grains existing adjacent thereto undergo large stress. As a result, part of the smaller grains or the smaller grains themselves scatter to stick on a substrate as the giant dust.

In the second sputtering target of the present invention, the ratios of grain sizes of the adjacent grains are set in the range of 0.1 to 10. By thus reducing the ratio of grain sizes of the adjacent grains, stress difference generated in the course of the grains recovering the strain can be alleviated. Thereby, the giant dust can be suppressed from occurring to result in a remarkable increase of the yield of the Nb films or interconnection films comprising the same.

BRIEF DESCRIPTION OF THE DRAWING

FIG. 1 is a diagram showing one example of configuration of a semiconductor device having a DD interconnection structure deposited by use of a sputtering target of the present invention.

MODES FOR IMPLEMENTING THE INVENTION

In the following, modes for implementing the present invention will be explained.

A sputtering target of the present invention consists of high purity Nb. It is said that an amount of impurity element in the sputtering target is generally desirable to reduce. In the present invention, an impurity element influencing particularly on characteristics of a Nb film deposited with a Nb target of the present invention is found. Based on the above finding, an amount of a particular element is reduced and dispersion of the amount of the impurity element is suppressed low.

In concrete, a sputtering target of the present invention consists of high purity Nb of which Ta content is 3000 ppm or less. Further, the sputtering target of the present invention consists desirably of high purity Nb of which oxygen content is 200 ppm or less.

Since Nb and Ta are in an adjacent relationship in the periodic table, Nb raw material necessarily contains Ta. These Nb and Ta are generally called refractory metals and, being together 5A group elements, have very similar properties. Accordingly, it is not easy to separate Ta from Nb and resultantly ordinary Nb material contains relatively large amount of Ta as an impurity element.

However, Ta is easily oxidized and the resultant Ta oxide such as $Ta_2O_5$ is very stable. In addition, Ta reacts easily with Al to form an intermetallic compound such as $Al_3Ta$ above a certain temperature. These, oxide and intermetallic compound containing Ta, when existing in an interconnection film, play a role of increasing the resistivity.

When Ta is contained much in the Nb target or there is a large dispersion of the Ta content, within the Nb film deposited therewith or at an interface with Al film deposited thereon, $Ta_2O_5$ or $Al_3Ta$ are rapidly formed to result in an increase of the resistivity of the interconnection film. Actually, in a trench interconnection a Nb film is deposited due to the sputtering, thereafter an Al—Cu film is formed. The interface thereof is investigated. As the result, $Ta_2O_5$ is detected much and such Al interconnection film is found to be high in the resistivity. From the above results, the reason of incapability of suppressing with reproducibility the resistivity of the interconnection film using the existing Nb target to for instance 4 μΩcm or less is found to come from Ta contained in the Nb, further oxygen causing $Ta_2O_5$ or the like to form.

Accordingly, in the present sputtering target, a Ta content in Nb constituting the target is set at 3000 ppm or less. Thus, by suppressing the Ta content in the Nb target to 3000 ppm or less, an amount of Ta in a Nb film deposited therewith can be reduced. Accordingly, an amount of $Ta_2O_5$ or $Al_3Ta$ formed or existing within the Nb film or at an interface with an Al film deposited thereon can be largely reduced.

Furthermore, in the present sputtering target, an oxygen content in Nb constituting the target is set at 200 ppm or less. The Nb film deposited with the Nb target like this is low in the oxygen content that is one reason of generating Ta oxide ($Ta_2O_5$ or the like). Thereby, an amount of $Ta_2O_5$ precipitating at an interface between the Nb film and an Al film (or Al alloy film) deposited thereon can be remarkably reduced.

Thereby, the resistivity of the interconnection film comprising the Nb film can be largely reduced. In particular, it largely contributes in reducing the resistivity of the Al interconnection film having the Nb film as liner material. The Ta content in the sputtering target is preferable to be 2000 ppm or less, and further preferable to be 1000 ppm or less. The oxygen content in the sputtering target is preferable to be 150 ppm or less, and further preferable to be 100 ppm or less. Thereby, the resistivity of the interconnection film can be further reduced.

Dispersion of the Ta content in the target of the present invention is preferably to be within 30%. Thus, by suppressing the dispersion of the Ta content low in the target, the resistivity over the whole interconnection film formed therewith can be lowered with reproducibility. The dispersion of the Ta content in the target is further preferable to be within 15%.

Dispersion of the oxygen content in the sputtering target of the present invention is preferably to be within 80%. Thus, by suppressing the dispersion of the oxygen content low in the target, the resistivity over the whole interconnection film formed therewith can be lowered with reproducibility. The dispersion of the oxygen content in the target is further preferably to be within 50%, and still further to be within 30%.

The aforementioned dispersions of the Ta and oxygen contents indicate values obtained in the following ways. For instance, from a surface of a sputtering target of a diameter of 320 to 330 mm, specimens for analysis are sampled from 9 points. The respective specimens are sampled from a center of the target and the respective positions of ±75 mm and ±150 mm respectively in the directions of X and Y axes with respect to the center. Of these 9 specimens for analysis, the Ta content and oxygen content are measured. From the minimum and maximum values thereof, with the following equation, dispersion is obtained.

Dispersion [%]={(maximum value−minimum value)/(maximum value+minimum value)}×100

The Ta content is measured with ICP-AES (inductively coupled plasma-atomic emission spectroscopy) that is usually used. The oxygen content is measured with LECO' inert gas fusion/infrared absorption spectroscopy. Sampling positions on the target are appropriately adjusted according to the target size.

Concerning other impurities than Ta and oxygen in the sputtering target of the present invention, up to an approximate level of general-purpose high purity metal material, a slight amount can be acceptable. However, in view of lowering the interconnection resistance, other elements are also preferable to be reduced similarly.

The present sputtering target consisting of high purity Nb is further preferable to control the size of the Nb grains constituting the target in the following way. That is, a grain diameter of each grain is in the range of 0.1 to 10 times an average grain diameter and a grain size ratio of adjacent grains is in the range of 0.1 to 10.

There are many reports on the relationship between the grain diameter of a target and the dust. Usually, the so-called dust is generated in the following ways. In one way, grains flied off during the sputtering adhere to an adhesion preventive plate or a non-erosion area of the target disposed in a sputtering apparatus. These peel off in flake to generate the dust. In the other way, due to a potential difference generated in a gap between the grains, there occurs an abnormal discharge to result in generation of molten grains called splash. Usually ones of which size is approximately 0.2 to 0.3 μm are called the dust.

However, the dust suddenly generated from the existing Nb sputtering target is as large as 1 μm or more in size, which is remarkably large in comparison with that from the existing one. The shape is also as massive as rock is. As the result of various investigations of the massive dust, it is found in a mode such that part of the grain or grain itself is extracted due to the sputtering. The inventors of the present invention carried out investigations while Paying attention to the grain sizes of the adjacent grains and found that when there is a large difference in grain diameters of adjacent grains, the aforementioned giant dust occur.

That is, a target surface undergoes a considerable thermal influence due to the sputtering and the respective grains try to recover the strain thereof. An amount of the strain that each grain possesses differs depending on the size thereof. In the course of the larger grain recovering the strain, smaller grains, when existing adjacent to the larger grain, are subjected to much stress. As the result, there occurs a phenomenon that part of the smaller grain or the smaller grain itself flies off.

When due to the difference of grain sizes of the adjacent grains like this the part of the grain or the grain itself flies off, it adheres on a substrate as giant dust t result in a decrease of yield of the Nb film. Accordingly, in the present sputtering target, a ratio of the grain sizes of the adjacent grains is set in the range of 0.1 to 10.

By setting the ratio of grain sizes of the adjacent grains 10 times or less or $^1/_{10}$ or more, in the course of the grains undergone the thermal influence trying to recover the strain, difference of stress can be alleviated. Thereby, the part of the grain or the grain itself can be prevented from flying off. As the result, the giant dust is suppressed from occurring and the yield of the Nb film or the interconnection film comprising the Nb film can be largely improved. The grain size ratio of the adjacent grains is preferable to be in the range of 0.5 to 5, and further preferable to be in the range of 0.5 to 1.5.

The dispersion of the grain size ratio of adjacent grains in the target is preferable to be within 30%. Thus, by suppressing the dispersion of the grain size ratio low in the target, the Nb film can be suppressed from the occurrence of giant dusts. The dispersion of the grain size ratio of adjacent grains in the sputtering target is preferable to be within 15%, and further preferable to be within 10%.

The grain size ratio of the adjacent grains can be obtained in the following ways. First, a straight line is drawn on a grain structure micrograph taken under an arbitrary magnification (optical micrograph under a magnification of 200 times, for instance). Of 30 grains on the straight line and adjacent with each other, grain diameters (in this case, the grain diameter denotes a diameter of the minimum circle circumscribing one grain) are measured. The aforementioned grain size ratio denotes a ratio of grain sizes of adjacent grains in this case.

The dispersion of the grain size ratio denotes a value obtained in the following ways. For instance, for analysis, 9 specimens are sampled from a surface of the sputtering target of a diameter of 320 to 330 mm. The specimens each are sampled from the center of the target and positions located at 75 mm and 150 mm from the center in directions of X-axis and Y-axis relative to the center, respectively. The grain size ration is measured of each of these 9 specimens for analysis. The dispersion is obtained from the maximum and minimum values thereof with the following formula.

Dispersion [%]={(the maximum value−the minimum value)/(the maximum value+the minimum value)}×100

For the Nb grains in the sputtering target, as mentioned above, the grain size ratio between the adjacent grains are particularly important to be in the range of 0.1 to 10. However, when the dispersion of the grain diameter of the Nb grains is large, there are many grains different in sputtering rate to result in larger steps between the adjacent grains. Accordingly, the grain diameters of the Nb grains are set in the range of 0.1 to 10 times an average grain diameter.

The concrete average grain diameter of the Nb grains is preferable to be in the range of 100 μm or less. When the average grain diameter exceeds 100 μm, the dust increases to result in a larger dispersion of the interconnection resistance of the obtained thin films. The average grain diameter of the Nb grains is preferable to 75 μm or less, and further preferable to be 50 μm or less.

The average grain diameter of the Nb grains denotes a value obtained in the following ways. First, similarly with the case of measurement of the composition dispersion, specimens are sampled from the surface of the sputtering target. Each specimen is polished, followed by etching with an etching solution of $HF:HNO_3:H_2O=2:2:1$, thereafter observed of texture by use of an optical microscope. On a micrograph taken under a magnification of 200 times, a circle of a diameter of 50 mm is drawn. The number of grains contained in the circle and not traversed by a circumference (number of grains: A) and number of grains traversed by the circumference (number of grains: B) are counted. Based on [total number of grains in the circle=the number A+number B/2], an area per a grain is calculated. Assuming a section of one grain a circle, the average grain diameter is calculated as the diameter thereof.

The sputtering target of the present invention can be manufactured in the following ways for instance.

First, high purity Nb that is formation raw material of a sputtering target is prepared. In specific, $Nb_2O_5$ containing concentrate of which Ta content is 3000 ppm or less is chemically processed to be high purity oxide. Then, by making use of thermite reduction method due to Al, crude metal Nb is obtained. This is for instance electron beam melted (EB) to refine high purity Nb.

Here, a step of melting due to the EB melting, with intentions of reducing the Ta content and the dispersion thereof, and further with an intention of reducing the oxygen content and the dispersion thereof, is preferable to repeat multiple times. To reduce the dispersion of the Ta content, it is also effective to uniformly disperse Ta existing in Nb due to zone refining method.

Next, to the obtained Nb ingot, plastic working due to forging and rolling is applied. The working rate during the plastic working is set at for instance 50 to 98%. According to the plastic working of the working rate like this, an adequate amount of heat energy can be given to the ingot. Due to the energy, Ta or oxygen can be homogenized (reduction of the dispersion). In the step of plastic working, as demands arise, intermediate heat treatment can be implemented.

The energy given by the aforementioned plastic working destroys grains of the ingot. Furthermore, it works effectively in removing minute internal defects. Thereafter, at a temperature of approximately 800 to 1300° C., heat treatment is applied for 1 hour or more. By applying the heat treatment to the Nb material of which grains are once destroyed due to the plastic working to make the Nb grain structure recrystallize, the grain diameters of the Nb grains can be controlled. In specific, the grain diameter of each grain can be made to be in the range of 0.1 to 10 times an average grain diameter and the grain size ratios of the adjacent grains can be made to be in the range of 0.1 to 10. The recrystallization contributes to reduce the dispersion of the Ta content and oxygen content.

Thus obtained high purity Nb raw material is machined into a desired disc-like shape and bonded with a backing plate consisting of for instance Al. In bonding with the backing plate, the diffusion bonding due to the hot pressing is preferably applied. The temperature during the diffusion bonding is preferable to be in the range of 400 to 600° C. Because, thereby, Al of which melting point is 660° C. is prevented from plastically deforming, diffusion of Ta atoms and oxygen atoms in the target is suppressed from occurring, and further an adverse effect on the grain diameter of the Nb grain in the target is suppressed from exerting. The raw material obtained here is machined into a prescribed size thereby a sputtering target of the present invention can be obtained.

The sputtering target of the present invention, though capable of using for forming interconnection films of various kinds of electronic devices, can be particularly preferably used in forming a Nb film as liner material to an Al film (or Al alloy film). A Nb film sputter deposited with a sputtering target of the present invention is 3000 ppm or less in Ta content, and further 2000 ppm or less, 1000 ppm or less, and the dispersion of the Ta content in the target is within 30%, and further within 15%. The oxygen content is 200 ppm or less, and further 150 ppm or less, 100 ppm or less, and the dispersion of the oxygen content is within 80%, and further within 50%, and furthermore within 30%. In addition, the number of the dust particles (giant dust in particular) is remarkably scarce.

The Nb film like this is, as mentioned above, suitable for the liner material of the Al interconnection. By giving an Al film or Al alloy film on the Nb film obtained due to the present invention, an interconnection film can be constituted. According to such interconnection film, an interconnection structure suitable for applying the DD interconnection technology can be provided. Thereby, the resistivity such as 4 μΩcm or less for instance that is demanded for DRAMs of 256 Mbit or 1 Gbit can be satisfied sufficiently and with reproducibility. This largely contributes in suppressing signal delay. Further, high density interconnection can be realized with high reliability and reproducibility. This largely contributes in improving the yield of the interconnection films.

The interconnection films such as mentioned above can be used in various kinds of electronic components typical in semiconductor devices. In specific, the semiconductor devices such as ULSIs and VLSIs, and electronic components such as SAW devices, TPHs and LCD devices can be cited.

FIG. 1 is a sectional view showing one example of configuration of a semiconductor device comprising a DD interconnection structure having a Nb film deposited by use of the sputtering target of the present invention. In FIG. 1 reference numeral 1 denotes Si substrate thereon an element configuration is formed. On the Si substrate 1, an insulating film 2 is formed, thereon 2 a first Al interconnection 3 being formed connected with an element structure through a contact hole (not shown in the FIGURE).

On the insulating film 2 having the first Al interconnection 3 an interlayer dielectric film 4 is formed, thereon 4 interconnection trenches 5 (5a, 5b and 5c) being disposed. The interconnection trenches 5a, 5b and 5c are disposed on a surface side of the interlayer dielectric film 4. The interconnection trench 5b is formed so as to reach the first Al interconnection 3, that is an interconnection hole (via hole).

In each of the interconnection trenches 5a, 5b and 5c, first a Nb film 6 deposited by use of the present sputtering target is formed as liner material. On the Nb film 6, a second Al interconnection 7 consisting of an Al film or an Al alloy film is formed. Thereby, an Al interconnection film 8 of the DD structure is constituted. In the FIGURE, reference numeral 9 denotes an insulating film.

The Al interconnection film 8 having the Nb film 6 deposited by use of the present sputtering target, as mentioned above, satisfies the resistivity as low as 4 μΩcm or less. Accordingly, performance characteristic or reliability of the semiconductor devices such as DRAMs of for instance 256 Mbit or 1 Gbit or more can be improved. Further, the giant dust being scarcely mixed, the high density interconnection can be realized with high reliability and reproducibility.

Next, concrete embodiments of the present invention and evaluation results thereof are described.

Embodiment 1

First, $Nb_2O_5$ containing concentrate of which Ta content is 3000 ppm or less is chemically processed to be a high purity oxide, the oxide being reduced by making use of thermite reduction method due to Al to obtain crude metal Nb.

Several pieces of such crude metal Nb are prepared. These are EB melted appropriately between one to multiple times to prepare 6 kinds of Nb ingots (diameter of 230 mm) different in the Ta content.

Each of these Nb ingots is drawn and forged to be a diameter of 130 mm, being annealed at a temperature of 1400° C., thereafter being forged again to be a diameter of 230 to 240 mm, and further being rolled by use of cross-rolling to be a disk of a diameter of 320 to 330 mm. To these disc-like Nb plates, heat treatment is applied under the conditions of 1100° C.×120 min to recrystallize.

The respective Nb plates after the aforementioned heat treatment are cut to be Nb plates for bonding, these and Al alloy plates for backing plate prepared in advance being hot pressed under the conditions of a temperature of 400 to 600° C. and a pressure of 250 kg/cm$^2$ to be bonded bodies that are target raw material. Each of thus obtained bonded bodies is machined to be a diameter of 320 mm×a thickness of 10 mm, thereby an intended Nb sputtering target being obtained.

The Ta contents and dispersions thereof are measured of thus obtained 6 kinds of Nb targets based on the aforementioned method. The Ta content is analyzed by use of usually used ICP-AES (Inductively Coupled Plasma Atomic Emission Spectrometry apparatus: Seiko Instrument Industries' product SPS1200A (Commercial Name)). The Ta contents and dispersion thereof in the Nb targets are shown in Table 1.

Next, with each of the aforementioned 6 kinds Nb sputtering targets, under the conditions of sputtering method of liner sputtering, a back pressure of $1 \times 10^{-5}$ (Pa), a DC output of 15 (kW) and a sputtering time of 1 (min), on a Si wafer (8 inches) with previously formed interconnection trench a Nb film is formed. Thereby, a liner film of a thickness of 0.5 µm is formed including the inside of the interconnection trench. Thereafter, with an Al-0.5% by weight of Cu target, the sputtering is implemented under the conditions identical with the aforementioned conditions to form an Al thin film of a thickness of approximately 1 µm. After the Al thin film is filled in the interconnection trench due to the reflow treatment, an excess of the Al film is removed due to the CMP to form an interconnection. Each resistivity of these interconnections is measured. The results are shown in Table 1.

TABLE 1

| Target No. | Ta Content (ppm) | Dispersion of Ta Content (%) | Resistivity of Interconnection (µΩ cm) |
| --- | --- | --- | --- |
| No. 1 | 550 | 11 | 3.1 |
| No. 2 | 1550 | 27 | 3.5 |
| No. 3 | 1830 | 40 | 3.9 |
| No. 4 | 2540 | 5 | 3.8 |
| No. 5 | 3300 | 17 | 10.5 |
| No. 6 | 8220 | 58 | 15.8 |

As obvious from Table 1, it is found that interconnection films each comprising a Nb film formed by use of each of the present Nb targets of specimen 1 to specimen 4 are one half or less in resistivity compared with that of the other interconnection films. By employing the interconnection film having such Nb liner film, the interconnection can be reduced in the resistivity, and further product yield can be largely improved.

Embodiment 2

Crude metal Nb prepared similarly with Embodiment 1 is EB melted three times to prepare an ingot. The Nb ingot undergoes plastic working under the conditions identical with Embodiment 1, thereafter by varying the heat treatment condition 6 kinds of Nb materials are prepared. The heat treatment temperatures are 300° C., 600° C., 800° C., 1100° C. and 1300° C., and treatment time periods are 60 min for all heat treatments. In addition, Nb material that is not heat-treated is prepared.

With such 6 kinds of Nb materials, similarly with Embodiment 1 Nb sputtering targets are prepared, respectively. The Ta content is analyzed due to an IPC-AES similarly with Embodiment 1. The Ta content is 1830 ppm, the dispersion thereof being 20%.

Next, with each of the aforementioned 6 kinds Nb sputtering targets, under the conditions of sputtering method of liner sputtering, a back pressure of $1 \times 10^{-5}$ (Pa), a DC output of 15 (kW) and a sputtering time period of 1 (min), on a Si wafer (8 inches) with previously formed interconnection trench a Nb film is formed. Thereby, a liner film of a thickness of 0.5 µm is formed including the inside of the interconnection trench. Thereafter, with an Al-0.5% by weight of Cu target, the sputtering is implemented under the conditions identical with the aforementioned conditions to form an Al thin film of a thickness of approximately 1 µm. After the Al thin film is filled in the interconnection trench due to the reflow treatment, an excess of the Al film is removed due to the CMP to form an interconnection. Each resistivity of these interconnections is measured. The results are shown in Table 2.

TABLE 2

| Target No. | Heat Treatment Temperature (° C.) | Resistivity of Interconnection (µΩ cm) |
| --- | --- | --- |
| No. 1 | Without heat treatment | 3.8 |
| No. 2 | 300 | 3.7 |
| No. 3 | 600 | 3.5 |
| No. 4 | 800 | 3.2 |
| No. 5 | 1100 | 3.1 |
| No. 6 | 1300 | 3.1 |

As obvious from Table 2, interconnection films each comprising a Nb film formed by use of the present Nb sputtering target show excellent resistivity. Accordingly, by use of the interconnection film having such Nb liner film, the interconnection can be made low in the resistivity, and the product yield can be largely improved.

Embodiment 3

First, crude metals of Nb are prepared by varying oxygen contents. These are EB melted appropriately between one to multiple times to prepare 6 kinds of Nb ingots (diameter of 230 mm) of different oxygen contents.

Each of these Nb ingots is drawn and forged to be a diameter of 130 mm, being annealed at a temperature of 1400° C., thereafter being forged again to be a diameter of 230 to 240 mm, and further being rolled by use of cross-rolling to be a disk of a diameter of 320 to 330 mm. To these disc-like Nb plates, heat treatment is applied under the conditions of 1100° C.×120 min to recrystallize.

The respective Nb plates after the aforementioned heat treatment are cut to be Nb plates for bonding, these and Al alloy plates for backing plate prepared in advance being hot pressed under the conditions of a temperature of 400 to 600° C. and a pressure of 250 kg/cm² to be bonded bodies that are target raw material. Each of thus obtained bonded bodies is machined to be a diameter of 320 mm×a thickness of 10 mm, thereby an intended Nb sputtering target being obtained.

The oxygen contents and dispersions thereof are measured of thus obtained 6 kinds of Nb targets based on the aforementioned method. The oxygen content is analyzed by use of usually used inert gas melting infrared absorption (LECO' product TC-436 (Commercial Name)). The oxygen contents and dispersions thereof are shown in Table 3.

Next, with each of the aforementioned 6 kinds Nb sputtering targets, under the conditions of sputtering method of liner sputtering, a back pressure of $1\times10^{-5}$ (Pa), a DC output of 10 (kW) and a sputtering time of 3 (min), on a Si wafer (8 inches) with previously formed interconnection trench a Nb film is formed. Thereby, a liner film of a thickness of 20 µm is formed including the inside of the interconnection trench. Thereafter, with an Al-0.5% by weight of Cu target, the sputtering is implemented under the conditions identical with the aforementioned conditions to form an Al thin film of a thickness of approximately 1 µm. After the Al thin film is filled in the interconnection trench due to the reflow treatment, an excess of the Al film is removed due to the CMP to form an interconnection. Each resistivity of these interconnections is measured. The results are shown in Table 3.

TABLE 3

| Target No. | Oxygen Content (ppm) | Dispersion of Oxygen Content (%) | Resistivity of Interconnection (µΩ cm) |
|---|---|---|---|
| No. 1 | 10 | 82 | 4.2 |
| No. 2 | 10 | 40 | 3.0 |
| No. 3 | 50 | 23 | 3.1 |
| No. 4 | 60 | 64 | 3.1 |
| No. 5 | 100 | 27 | 3.2 |
| No. 6 | 110 | 68 | 3.4 |
| No. 7 | 140 | 38 | 3.5 |
| No. 8 | 320 | 31 | 4.1 |
| No. 9 | 630 | 22 | 4.4 |
| No. 10 | 820 | 20 | 4.7 |

As obvious from Table 3, it is found that interconnection films each comprising a Nb film deposited by use of each of the present Nb targets of specimen 2 to specimen 7 are lower in the resistivity compared with that of the other interconnection films. By employing the interconnection film having such Nb liner film, the interconnection can be reduced in the resistivity, and further product yield can be largely improved.

Embodiment 4

Under the conditions identical with that of the target of specimen 3 of Embodiment 3, a Nb ingot is prepared. The Nb ingot undergoes plastic working under the conditions identical with that of Embodiment 3, by varying the heat treatment conditions, 6 kinds of Nb materials are prepared. The heat treatment temperatures are 300° C., 600° C., 800° C., 1100° C. and 1300° C., and treatment time periods are 60 min for all heat treatments. Nb material that is not heat-treated is prepared.

With each of 6 kinds of Nb materials, similarly with Embodiment 1 Nb targets are prepared respectively. The oxygen content, as the result of measurement in the identical way with Embodiment 3, shows a value of approximately identical with specimen No. 3 in Embodiment 3.

Next, with each of the aforementioned 6 kinds Nb sputtering targets, under the conditions of sputtering method of liner sputtering, a back pressure of $1\times10^{-5}$ (Pa), a DC output of 10 (kW), a sputtering time of 3 (min), on a Si wafer (8 inches) with previously formed interconnection trench a Nb film is formed. Thereby, a liner film of a thickness of 20 µm including the inside of the interconnection trench is formed. Thereafter, with an Al-0.5% by weight of Cu target, the sputtering is implemented under the conditions identical with the aforementioned conditions to form an Al thin film of a thickness of approximately 1 µm. After the Al thin film is filled in the interconnection trench due to the reflow treatment, an excess of the Al film is removed due to the CMP to form an interconnection. Each resistivity of these interconnections is measured. The results are shown in Table 4.

TABLE 4

| Target No. | Heat Treatment Temperature (° C.) | Resistivity of Interconnection (µΩ cm) |
|---|---|---|
| No. 1 | Without heat treatment | 4.9 |
| No. 2 | 300 | 4.3 |
| No. 3 | 600 | 3.8 |
| No. 4 | 800 | 3.1 |
| No. 5 | 1100 | 2.9 |
| No. 6 | 1300 | 3.0 |

As obvious from Table 4, interconnection films each comprising a Nb film formed by use of each of the present Nb targets (specimen 3 to specimen 6) are excellent in resistivity. Accordingly, by employing the interconnection film having such Nb liner film, the interconnection can be reduced in the resistivity, and further product yield can be largely improved.

Embodiment 5

First, crude metal of Nb prepared identically with Embodiment 1 is EB melted to prepare an ingot of Nb of a diameter of 230 mm. To such the Nb ingot, forging and rolling similar with that of Embodiment 1 are implemented. However, by varying working conditions at each stage, with the respective working rates shown in Table 5, the plastic working is implemented. The working rate is calculated by use of the formula of {100−(thickness after plastic working/height of ingot)×100}.

To thus obtained disc-like Nb plates, heat treatment is applied under the conditions of 1100° C.×120 min to recrystallize. The respective Nb plates are cut to be Nb plates for bonding, these and Al alloy plates for backing plate prepared in advance being hot pressed under the conditions of a temperature of 400 to 600° C. and a pressure of 250 kg/cm² to be bonded bodies that are target raw material. Each of thus obtained bonded bodies is machined to be a diameter of 320 mm×a thickness of 10 mm, thereby an intended Nb sputtering target being obtained.

Next, with each of the aforementioned Nb sputtering targets, under the conditions of sputtering method of DC sputtering, a back pressure of $1\times10^{-5}$ (Pa), a DC output of 15 (kW) and a sputtering time of 1 (min), on a Si wafer (8 inches) a Nb film of a thickness of 0.5 µm is formed. 500 plates of Si substrates are deposited, respectively.

For the respective Nb films, a range of grain diameters relative to an average grain diameter of Nb grains, ratios of grain sizes of adjacent grains and dispersion thereof are measured. Further, number of the giant dust of a size of 1 μm or more in each Nb film is measured. These results are shown in Table 5.

TABLE 5

| Target No. | Working Rate (%) | Average Grain Diameter (μm) | Range of Grain Diameter to Average Grain Diameter (times) | Grain Size Ratio of Adjacent Grains | | Average Number of Dust (1 μm or more) (Pieces/Plate) |
|---|---|---|---|---|---|---|
| | | | | Ratio of Grain Size | Dispersion in a Target (%) | |
| 1 | 95 | 30 | 0.7 | 0.6 | 2 | 0 |
| 2 | 87 | 70 | 4.5 | 1.2 | 5 | 0 |
| 3 | 55 | 100 | 7.8 | 5.8 | 12 | 0 |
| 4 | 25 | 190 | 0.05 | 5 | 35 | 0.8 |
| 5 | 33 | 280 | 15.8 | 17 | 45 | 0.6 |
| 6 | 14 | 350 | 23.2 | 58 | 67 | 1.2 |

As obvious from Table 5, it is found that in the Nb films deposited with the present Nb sputtering targets (specimen No. 1 to 3), no giant dust exists, by contrast, in the Nb sputtering targets (specimen No. 4 to 6) prepared as the comparative examples of the present invention, the giant dust exists in the Nb films deposited therewith. Accordingly, by employing the Nb films of the present invention like this, the yield of the interconnection films and various devices therewith can be largely improved.

Embodiment 6

Similarly with Embodiment 5, to Nb plates thereto forging and rolling are applied with the working rate of 85%, no heat treatment, or 300° C., 600° C., 800° C., 1100° C. and 1300° C. heat treatments for 60 min each are applied to prepare 6 kinds of Nb materials. With these 6 kinds of Nb materials, similarly with Embodiment 1, the Nb sputtering targets are prepared, respectively.

Next, with each of the aforementioned Nb sputtering targets, under the conditions of sputtering method of DC sputtering, a back pressure of $1\times10^{-5}$ (Pa), a DC output of 15 (kW) and a sputtering time of 1 (min), on a Si wafer (8 inches) a Nb film of a thickness of 0.5 μm is formed. 500 plates of Si substrates are deposited, respectively.

For the respective Nb films, a range of grain diameters relative to an average grain diameter of Nb grains, ratios of grain sizes of adjacent grains and dispersion thereof are measured. Further, number of giant dust of a size of 1 μm or more in each Nb film is measured. These results are shown in Table 6.

As obvious from Table 6, in the Nb films deposited with the present Nb sputtering targets (specimen No. 4 to 6), there is found no giant dust. By contrast, in the Nb sputtering targets (specimen No. 1 to 3) prepared as the comparative examples of the present invention, there is found the giant dust in the Nb films deposited therewith.

Accordingly, by employing the Nb films of the present invention like this, the yield of the interconnection films and various devices therewith can be largely improved.

INDUSTRIAL APPLICABILITY

A Nb sputtering target of the present invention enables to obtain an interconnection film of low resistivity that has not been previously achieved. Alternatively, the present Nb sputtering target enables with reproducibility to suppress giant dust from occurring. Accordingly, according to an interconnection film deposited with such sputtering target, an interconnection of low resistivity can be achieved and further reliability or yield can be largely improved.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

The invention claimed is:

1. A method for manufacturing an Al interconnection having a dual damascene structure, comprising:
processing chemically a niobium oxide containing concentrate of which a Ta content is 3000 ppm or less to obtain a high purity niobium oxide,

TABLE 6

| Target No. | Heat Treatment Temperature (° C.) | Average Grain Diameter (μm) | Range of Grain Diameter to Average Grain Diameter (times) | Grain Size Ratio of Adjacent Grains | | Average Number of Dust (1 μm or more) (Pieces/Plate) |
|---|---|---|---|---|---|---|
| | | | | Ratio of Grain Sizes | Dispersion in a Target (%) | |
| 1 | Without Treatment | — | — | — | — | 3.5 |
| 2 | 300 | — | — | — | — | 1.2 |
| 3 | 600 | — | — | — | — | 0.1 |
| 4 | 800 | 10 | 0.5 | 7.8 | 1.2 | 0 |
| 5 | 1100 | 30 | 1.3 | 1.1 | 4.4 | 0 |
| 6 | 1300 | 70 | 4.7 | 0.7 | 12 | 0 | reducing the high purity niobium oxide by a thermite reduction method due to Al to obtain a Nb raw material, melting the Nb raw material at least two times by an electron beam melting to obtain a Nb ingot containing Ta in a range of 550 to 1000 ppm and oxygen in a range of 10 to 100 ppm as impurities;

plastic working the Nb ingot at a working rate in a range of 55 to 95% so as to disperse the Ta and the oxygen in the Nb ingot uniformly, to obtain a Nb plate in which a dispersion of the Ta content is within 15% and a dispersion of the oxygen content is within 30%, recrystallizing the Nb plate by heat-treating at a temperature in a range of from 800 to 1300° C. for one hour or more, to obtain the Nb plate including Nb grains having an average grain diameter in a range of from 10 to 75 μm, wherein each of the Nb grains has a grain diameter in a range of 0.1 to 10 times the average grain diameter, and a grain size ratio of adjacent grains in the Nb grains is in a range of 0.5 to 1.5;

machining the recrystallized Nb plate into a desired shape;

bonding the machined Nb plate with a backing plate made of Al or an Al alloy by hot-pressing at a temperature in a range of 400 to 600° C. while maintaining the average grain diameter of the Nb grains in the Nb plate, to prepare a Nb sputtering target;

preparing an insulating film having a trench;

forming a Nb liner film in the trench by sputtering the Nb sputtering target; and forming an Al interconnection film on the Nb liner film, wherein the Al interconnection film is composed of Al or Al alloy, and a resistivity of the Al interconnection film is 4 μΩcm or less.

2. The manufacturing method as set forth in claim 1, wherein the Nb liner film is formed along an inner wall of the trench, and the Al interconnection film is filled in the trench having the Nb liner film formed along the inner wall.

3. The manufacturing method as set forth in claim 1, wherein the average grain diameter of the Nb grains in the Nb sputtering target is in a range of 10 to 50 μm.

4. The manufacturing method as set forth in claim 1, wherein a dispersion of the grain size ratio of the adjacent grains in the Nb sputtering target is within 30%.

* * * * *